US012757336B2

(12) United States Patent
Kang et al.

(10) Patent No.: US 12,757,336 B2
(45) Date of Patent: Oct. 6, 2026

(54) DISPLAY DEVICE

(71) Applicant: LG DISPLAY CO., LTD., Seoul (KR)

(72) Inventors: Seoung-Mo Kang, Paju-si (KR); Young-Kyu Bang, Paju-si (KR); Sung-Hwan Yoon, Paju-si (KR); Eun-Gi Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 597 days.

(21) Appl. No.: 18/083,607

(22) Filed: Dec. 19, 2022

(65) Prior Publication Data

US 2023/0209736 A1 Jun. 29, 2023

(30) Foreign Application Priority Data

Dec. 27, 2021 (KR) ........................ 10-2021-0187978

(51) Int. Cl.

| | |
|---|---|
| ***H05K 5/00*** | (2025.01) |
| ***H05K 5/02*** | (2006.01) |
| ***H05K 5/13*** | (2025.01) |
| ***H10K 50/10*** | (2023.01) |
| ***H10K 102/00*** | (2023.01) |
| ***H10K 102/10*** | (2023.01) |

(52) U.S. Cl.

CPC ......... *H05K 5/0018* (2022.08); *H05K 5/0234* (2013.01); *H05K 5/0247* (2013.01); *H05K 5/13* (2025.01); *H10K 50/10* (2023.02); *H10K 2102/10* (2023.02); *H10K 2102/311* (2023.02)

(58) Field of Classification Search

None

See application file for complete search history.

(56) References Cited

U.S. PATENT DOCUMENTS

| | | | | |
|---|---|---|---|---|
| 2021/0007230 | A1* | 1/2021 | Kang | H05K 1/18 |
| 2021/0056872 | A1* | 2/2021 | Kwon | H05K 1/189 |
| 2021/0185835 | A1* | 6/2021 | Song | G02F 1/133322 |
| 2021/0207761 | A1* | 7/2021 | Kim | G09F 9/30 |
| 2021/0345773 | A1* | 11/2021 | Choi | A47B 81/06 |
| 2021/0397061 | A1* | 12/2021 | Park | G02F 1/167 |

(Continued)

FOREIGN PATENT DOCUMENTS

| | | |
|---|---|---|
| CN | 212165234 U | 12/2020 |
| CN | 113299203 A | 8/2021 |
| CN | 214315426 U | 9/2021 |

(Continued)

OTHER PUBLICATIONS

Lee (KR-20060040817-A) (Year: 2006).*

(Continued)

*Primary Examiner* — Hung S. Bui
*Assistant Examiner* — Elisa Sasserath
(74) *Attorney, Agent, or Firm* — Fish & Richardson P.C.

(57) ABSTRACT

A display device includes a cover module having a storage space therein, a display panel configured to be at least partially disposed inside the storage space or withdrawn outside the storage space, a first driving system configured to embed the display panel into the cover module or withdraw the display panel from the cover module in a first direction, and a first elevation assistance system disposed inside the storage space and configured to control a speed of raising and lowering the display panel.

17 Claims, 10 Drawing Sheets

(56) References Cited

U.S. PATENT DOCUMENTS

2025/0167131 A1* 5/2025 Chan .................... H10W 42/20

FOREIGN PATENT DOCUMENTS

| | | | | |
|---|---|---|---|---|
| CN | 215006995 U | | 12/2021 | |
| KR | 10-2006-0040817 | | 5/2006 | |
| KR | 20060040817 A | * | 5/2006 | ............ B31B 50/52 |
| KR | 10-2021-0050800 A | | 5/2021 | |
| KR | 10-2252766 B1 | | 5/2021 | |

OTHER PUBLICATIONS

Lee et. al (KR-20060040817-A) (Year: 2006).*

Office Action in Chinese Appln. No. 202211639372.X, mailed on Jan. 27, 2026, 16 pages (with English translation).

* cited by examiner

DISPLAY DEVICE

CROSS-REFERENCE TO RELATED APPLICATION

The present application claims the priority of Korean Patent Application No. 10-2021-0187978 filed on Dec. 27, 2021, which is hereby incorporated by reference in its entirety.

BACKGROUND

Field of the Disclosure

The present disclosure relates to a display device, and more particularly to, for example, without limitation, a display device including a display panel capable of being raised or lowered.

Description of the Background

In recent years, with entering into a full-fledged information age, there is a growing interest in information display dealing with and displaying mass information. In response to this, various flat panel display devices have been developed and have been in the spotlight.

Specific examples of the flat panel display devices include but are not limited to liquid crystal display (LCD) devices, plasma display panel (PDP) devices, field emission display (FED) devices, electroluminescence display (ELD) devices, organic light-emitting diode display (OLED) devices. The flat panel display devices show excellent performance of thin thickness, light weight, and low power consumption and have rapidly replaced cathode ray tube (CRT) display devices.

Recently, in the progress of further development of technologies for implementing such display devices, technologies for realizing various display devices desired by consumers are also required beyond the technology for displaying an image.

Among these, research is being actively conducted to realize various types of display devices in which a display panel is coupled to structures such as furniture, appliances, vehicles, and facilities, and to have advantages of space utilization, interior, and design.

The description provided in the background section should not be assumed to be prior art merely because it is mentioned in or associated with the background section. The background section may include information that describes one or more aspects of the subject technology.

SUMMARY

Therefore, the inventors have recognized requirements described above. Accordingly, aspects of the present disclosure are to provide a display device that substantially obviates one or more of the issues due to limitations and disadvantages described above.

More specifically, aspects of the present disclosure are to provide a display device capable of embedding or withdrawing a display panel in a structure as necessary.

Aspects of the present disclosure are also to provide a display device in which a display panel is allowed to be embedded in or withdrawn from the inside of the structure with a simplified configuration and operation.

Aspects of the present disclosure are also to provide a display device capable of raising or lowering a display panel more stably in the process of embedding or withdrawing the display panel.

Additional features and aspects will be set forth in the description that follows, and in part will be apparent from the description, or may be learned by practice of the inventive concepts provided herein. Other features and aspects of the inventive concepts may be realized and attained by the structures particularly pointed out in the present disclosure, or derivable therefrom, and the claims hereof as well as the appended drawings.

To achieve these and other aspects of the inventive concepts, as embodied and broadly described herein, a display device may include a cover module having a storage space therein, a display panel disposed inside the storage space or withdrawn outside the storage space, a first driving system configured to embed the display panel into the cover module or withdraw the display panel from the cover module in a first direction, and a first elevation assistance system disposed inside the storage space and configured to control a speed of raising and lowering the display panel.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which may be included to provide a further understanding of the present disclosure and which may be incorporated in and constitute a part of the present disclosure, illustrate aspects of the disclosure and together with the description serve to explain various principles of the present disclosure.

In the drawings.

Figure 1A:
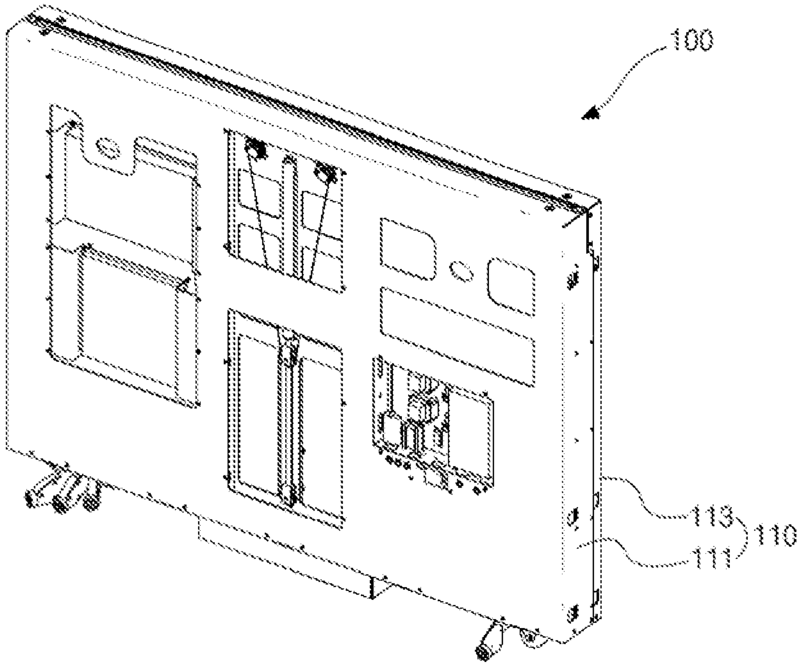
FIG. 1A is a perspective view schematically illustrating a display device with a display panel in an embedded state according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects may be provided so that this disclosure may be sufficiently thorough and complete to assist those skilled in the art to will fully understand the scope of the present disclosure.

Shapes, sizes, areas, ratios, angles, and numbers disclosed in the drawings for describing aspects of the present disclosure may be merely example, and thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration will be omitted or may be briefly provided. When terms "comprise," "have," and "include" described in the present disclosure may be used, another part may be added unless a more limiting term, such as "only" is used. The terms of a singular form may include plural forms unless referred to the contrary.

In construing an element, the element is construed as including an error or tolerance range although there is no explicit description of such an error or tolerance range.

In the description of the various aspects of the present disclosure, where position relationships, for example, where a positional relation between two parts is described using "on," "over," "under," "above," "below," "beside" and "next" or the like, one or more other parts may be located between the two parts unless a more limiting term, such as "immediate(ly)" or "direct(ly)" is used.

In describing a temporal relationship, for example, when the temporal order is described as, for example, "after," "subsequent," "next," and "before," a case that is not continuous may be included unless a more limiting term, such as "just," "immediate(ly)," or "direct(ly)" is used.

In describing elements of the present disclosure, the terms "first," "second," "A," "B," "(a)," "(b)," etc. may be used. These terms may be merely for differentiating one element from another element, and the essence, sequence, basis, order, or number of the corresponding elements should not be limited by these terms. The expression that an element is "connected," "coupled," or "adhered" to another element or layer should be understood to mean that the element or layer can not only be directly connected or adhered to another element or layer, but also be indirectly connected or adhered to another element or layer with one or more intervening elements or layers being "disposed," or "interposed" between the elements or layers, unless otherwise specified.

The term "at least one" should be understood as including any and all combinations of one or more of the associated listed items. For example, the meaning of "at least one of a first item, a second item, and a third item" encompasses the combination of all three listed items, combinations of any two of the three items as well as each individual item, the first item, the second item, or the third item.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, aspects of the present disclosure will be described in detail with reference to the accompanying drawings. Also, for convenience of description, a scale, size and thickness in which each of elements is illustrated in the accompanying drawings may differ from a real scale, size and thickness, and thus, the illustrated elements are not limited to the specific scale, size and thickness in which they are illustrated in the drawings.

Figure 1B:
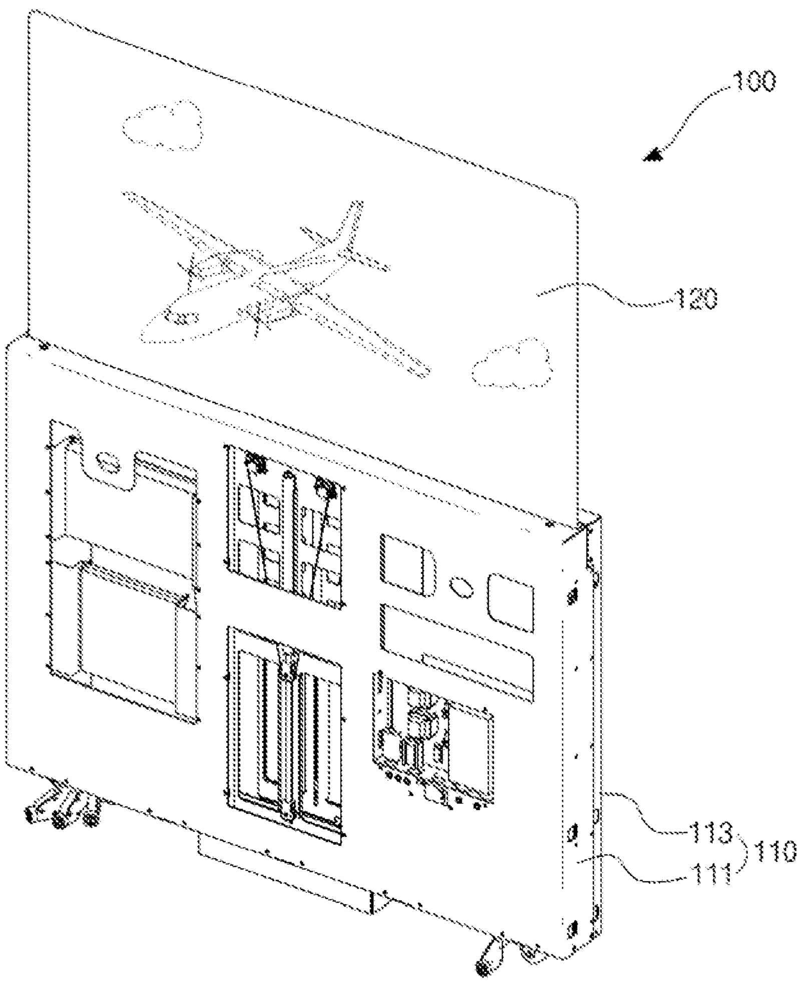
FIGS. 1B, 1C and 1D are perspective views schematically illustrating a display device with a display panel in various withdrawn states according to an aspect of the present disclosure.
Figure 1C:
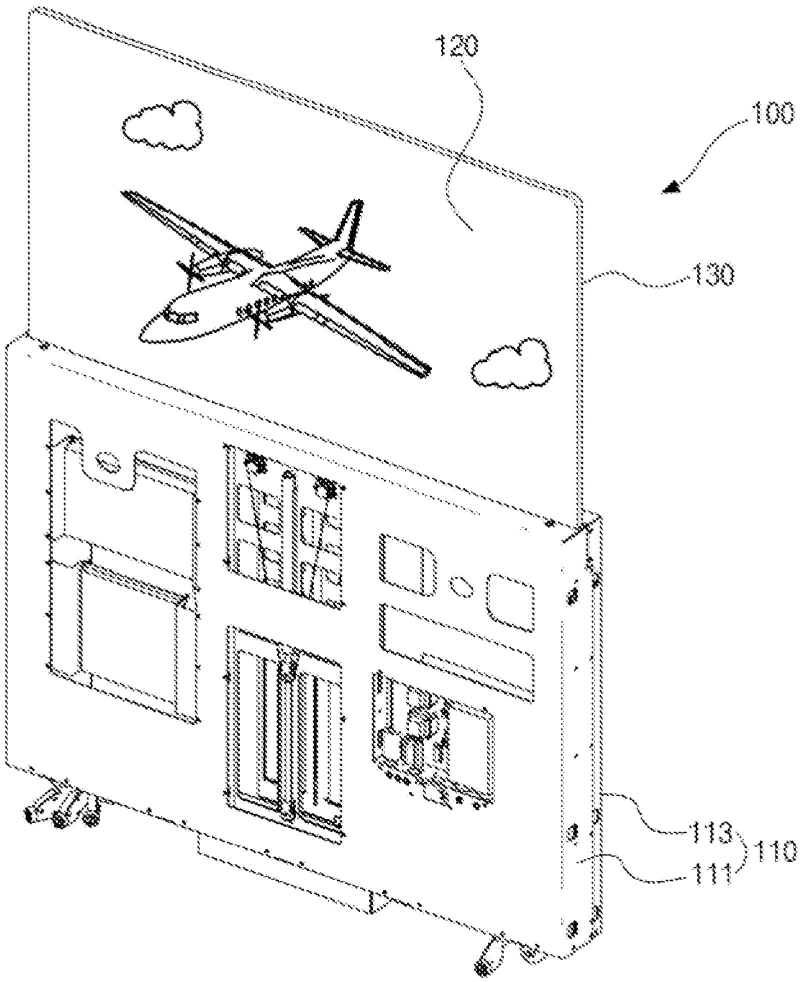
Figure 1D:
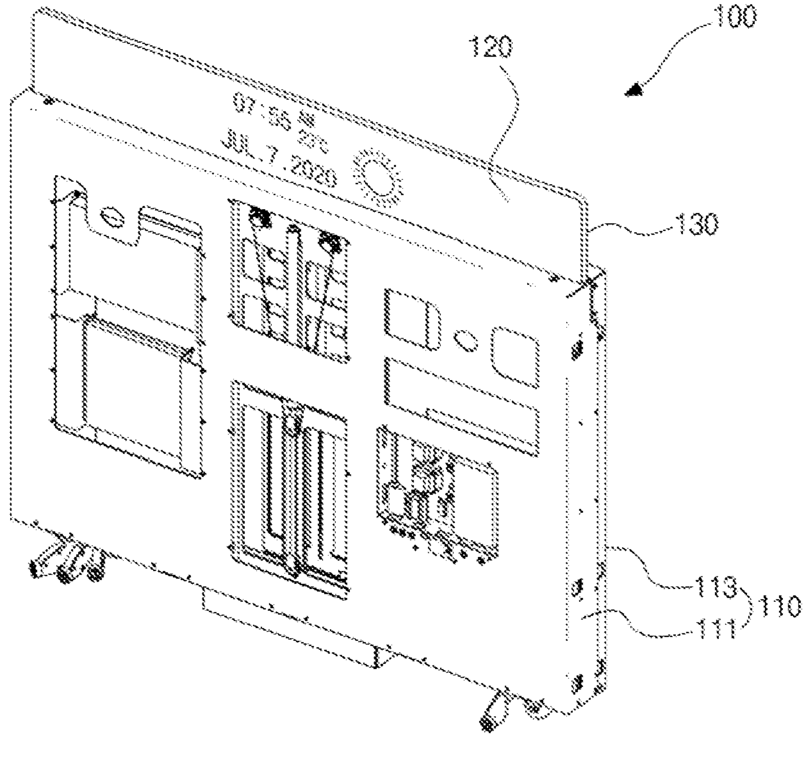

FIG. 1A is a perspective view schematically illustrating a display device with a display panel in an embedded state according to an aspect of the present disclosure, and FIGS. 1B, 1C and 1D are perspective views schematically illustrating a display device with a display panel in various withdrawn states according to an aspect of the present disclosure.

As shown in FIG. 1A, the display device 100 may include a display panel 120 (see FIG. 1B) that is embedded in a cover module 110. The cover module 110 can be coupled to furniture, a vehicle, an appliance, a facility, or the like such as a wall, a bed headboard, a desk, or a partition, or anything else having enough space to receive the cover module 110.

The display panel 120 pulled down and embedded inside the cover module 110, as shown in FIG. 1B, can be pulled up and withdrawn entirely to the outside of the cover module 110.

Here, the display panel 120 according to the aspect of the present disclosure can be formed of a transparent display panel, so that the user can see the object or image located on the opposite side through the display panel 120. In addition, the user can watch an image at both one side and the other side of the display panel 120. But aspects are not limited thereto. For example, the display panel 120 can also be formed of an opaque display panel, or a semitransparent display panel.

According to an aspect of the present disclosure, when the display panel 120 is formed of a transparent display panel, as shown in FIG. 1C, a light blocking plate 130 can be further withdrawn from the cover module 110 to the rear surface of the display panel 120. But aspects are not limited thereto. For example, the light blocking plate 130 can be omitted or can be separately provided without being embedded in the cover module 110.

By preventing the object or image located on the opposite side of the display panel 120 from being transmitted through the light blocking plate 130, the concentration of an image implemented through the display panel 120 can be improved. Accordingly, the user can feel the image implemented from the display panel 120 more clearly.

For example, the transparent display panel can realize the functions of information recognition, information processing, and information display as a transparent electronic device, thereby solving the spatial and visual constraints of existing electronic devices.

For example, the transparent display panel can be implemented as a smart window that is applied to a window of a building or a car to show a background or display an image. As recognized by the inventors of present disclosure, the transparent display panel does not have a limitation in contrast ratio in a dark environment, but has a disadvantage in that the contrast ratio is lowered in a general environment with light.

Therefore, the light blocking plate 130 can be further withdrawn from the cover module 110 to the rear surface of the display panel 120 so that a light blocking mode for blocking light and a transmission mode for transmitting light can be implemented in order to prevent or reduce a decrease in the contrast ratio of the transparent display panel.

In addition, as shown in FIG. 1D, in the display device 100 according to the aspect of the present disclosure, only a part of the display panel 120 can be withdrawn from the cover module 110, and the remaining part (e.g., most part) of the display panel 120 can be embedded inside the cover module 110, so that an Always On Display (AOD) device can also be implemented.

The AOD device can display AOD data that the user can check at any time even in a state where no image is displayed on the display panel 120. The AOD data can include, for example, but not limited to, information on date, time, weather, event alarming, temperature, and the like, and the AOD data can be variously changed automatically or according to the user's setting.

Figure 2:
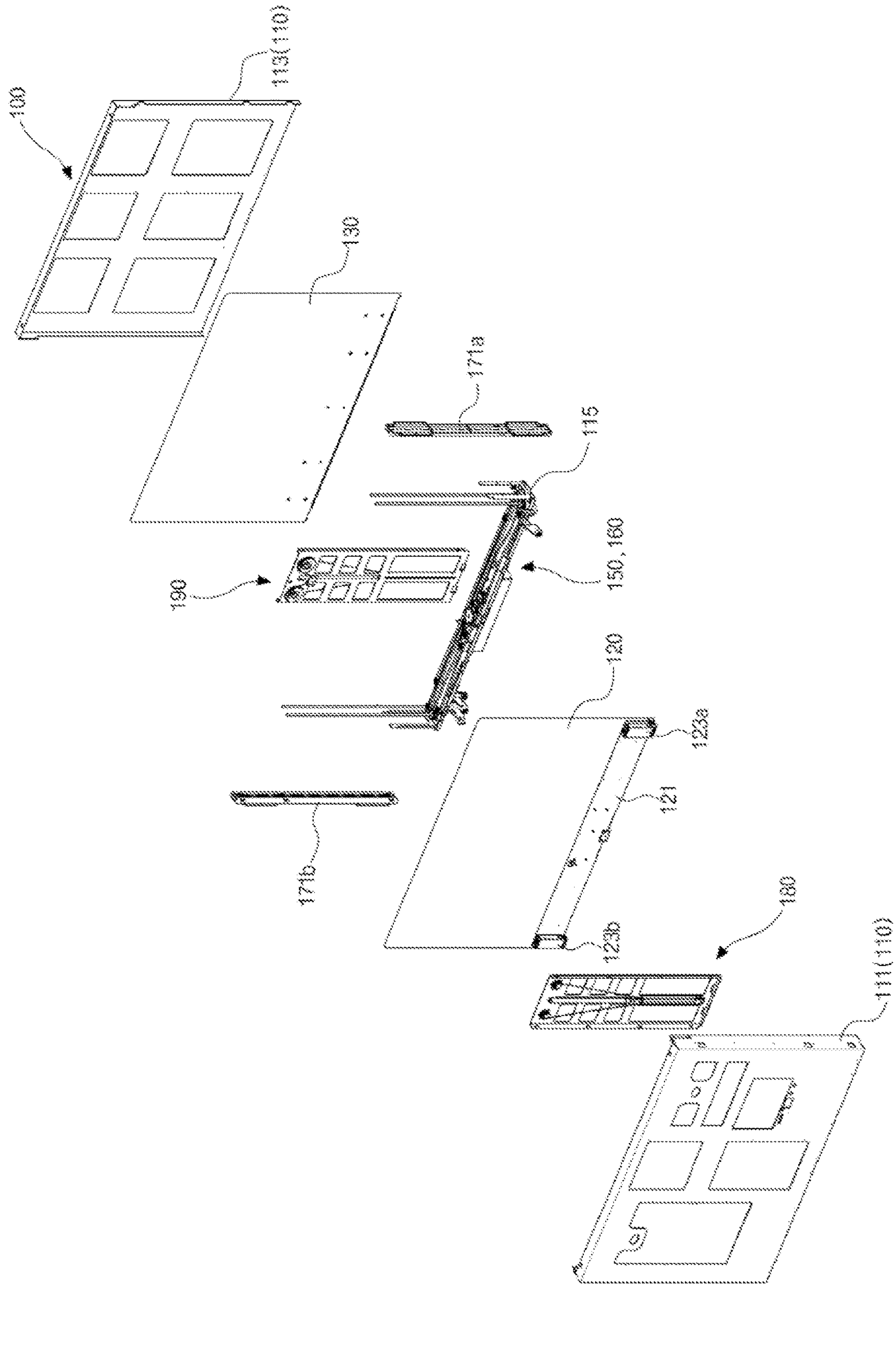
FIG. 2 is an exploded perspective view illustrating a display device according to an aspect of the present disclosure.
Figure 3A:
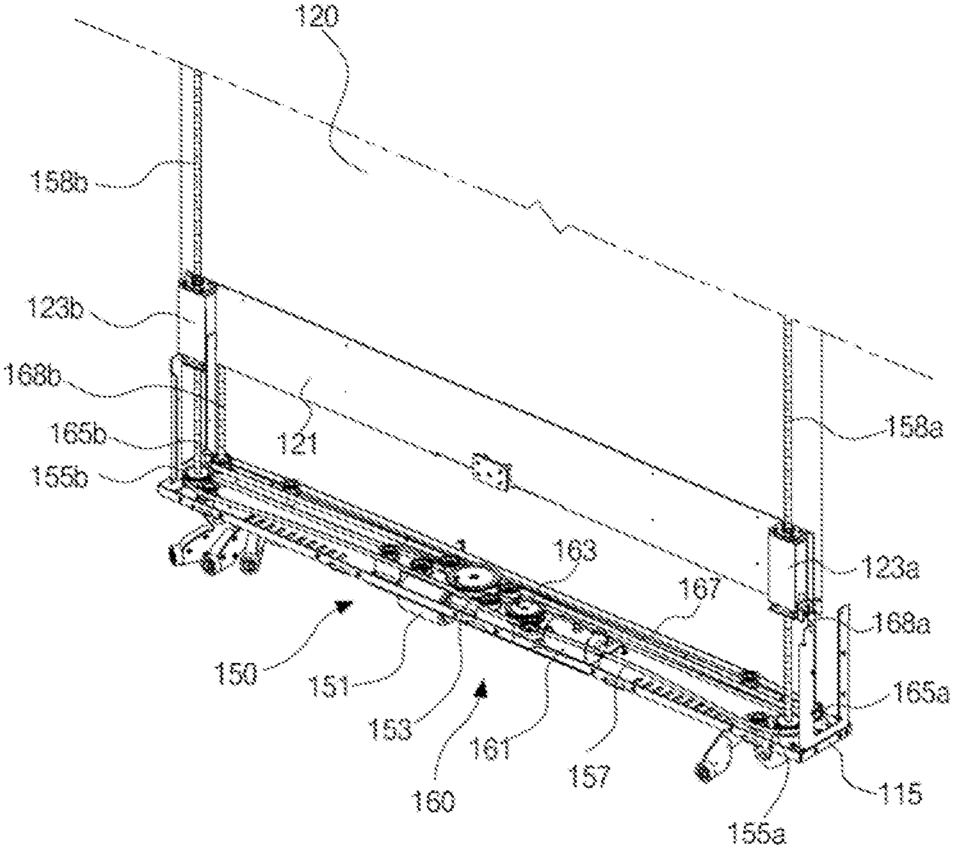
FIG. 3A is a perspective view illustrating a display panel and first and second driving systems according to an aspect of the present disclosure.
Figure 3B:
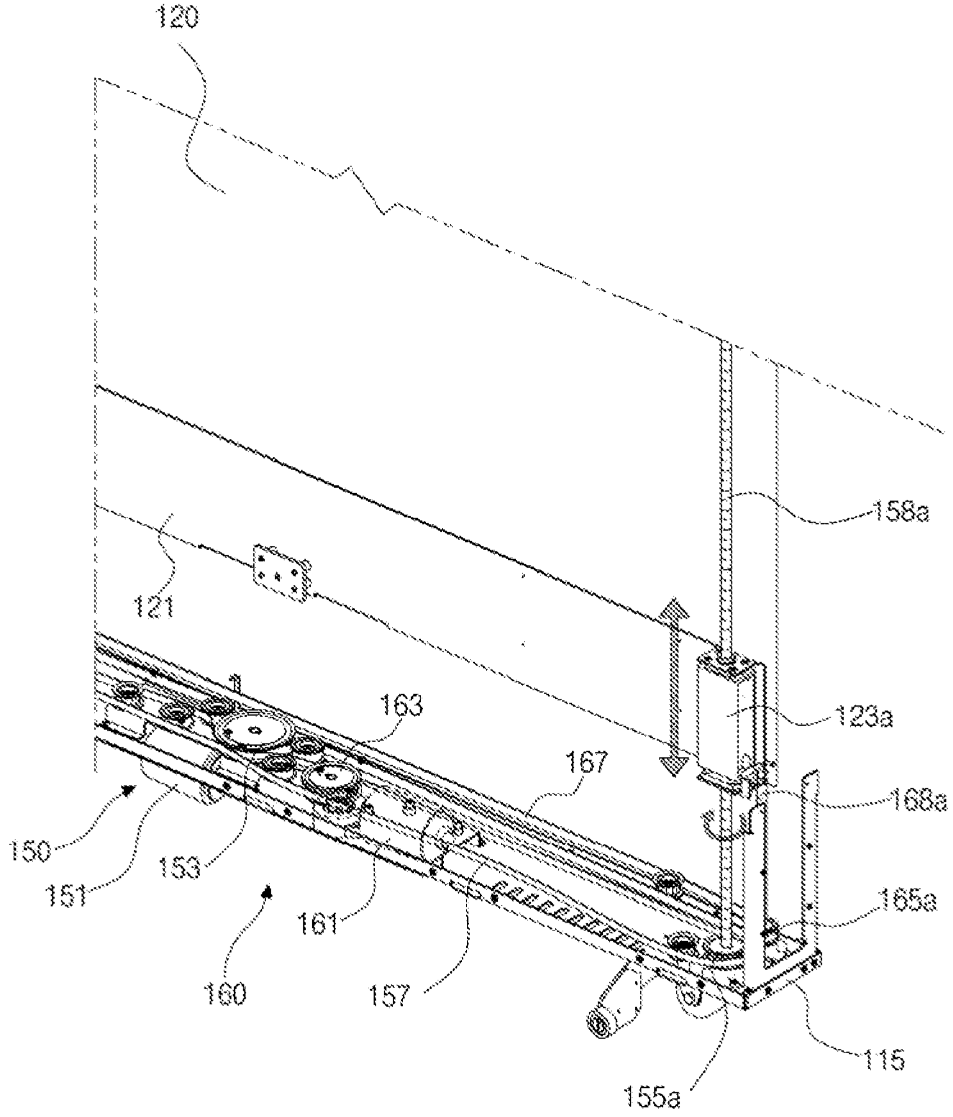
FIG. 3B is a perspective view illustrating an operation of the first driving system of FIG. 3A according to an aspect of the present disclosure.

FIG. 2 is an exploded perspective view illustrating a display device according to an aspect of the present disclosure. FIG. 3A is a perspective view illustrating a display panel and first and second driving systems according to an aspect of the present disclosure, and FIG. 3B is a perspective view illustrating an operation of the first driving system of FIG. 3A according to an aspect of the present disclosure.

As shown in the figures, the display device 100 according to the aspect of the present disclosure can include the cover module 110, the display panel 120, the light blocking plate 130, first and second driving systems 150 and 160, a pair of guide rails 171*a* and 171*b*, and first and second elevation assistance systems 180 and 190, but aspects of the present disclosure are not limited thereto.

The cover module 110 can have a box shape in which the display panel 110 and the first and second driving systems 150 and 160 are accommodated and can include a front cover 111 and a rear cover 113. The front cover 111 can be disposed on the front surface of the display panel 120, the light blocking plate 130 can be disposed on the rear surface of the display panel 120, and the rear cover 113 can be disposed on the rear surface of the light blocking plate 130.

Here, the display panel 120 can be one of various display devices such as a liquid crystal display device (LCD), a plasma display panel device (PDP), a field emission display device (FED), an electroluminescence display device (ELD), and organic light emitting diode display device (OLED), etc. The display panel 120 may use the OLED, which is a representative of a flexible display device capable of maintaining display performance even when bent like paper.

The OLED is a self-luminous device, and can be lightweight and thin because it does not require a backlight used in a liquid crystal display device that is a non-luminous device.

The OLED also has wide viewing angles and high contrast ratio as compared with the liquid crystal display device and is of lower power consumption. In addition, the OLED is driven by low voltages of direct current (DC) and has a fast response time. Further, the OLED is strong against the external impacts and is used in a wide range of temperatures because its components are solids.

Particularly, since the manufacturing process is simplified, the OLED has an advantage that the production cost can be greatly reduced compared to the liquid crystal display device.

The display panel 120 made of the OLED can include a first substrate and a second substrate facing the first substrate, and the first and second substrates can be spaced apart from and bonded to each other through an adhesive protective layer. But aspects are not limited thereto. The display panel 120 made of the OLED can also include only one substrate without a bonding process.

Although not shown, a driving thin film transistor can be formed for each pixel region on a first substrate, and a first electrode connected to each driving thin film transistor, an organic light emitting layer on the first electrode and emitting light of a specific color, and a second electrode on the organic light emitting layer can be provided for each pixel region.

The organic light emitting layer can express red, green, and blue colors. The expressed colors are not limited thereto. In general, a separate organic material emitting red, green, or blue light can be patterned and used for each pixel.

The first and second electrodes and the organic light emitting layer formed therebetween can constitute a light emitting diode. In the display panel having such a structure, the first electrode can serve as an anode, and the second electrode can serve as a cathode. However, the present disclosure is not limited thereto. Alternatively, the first electrode can serve as a cathode, and the second electrode can serve as an anode.

The display panel 120 according to the aspect of the present disclosure can include a transmission region and an emission region. The transmission region is a region that transmits the background seen through the rear surface of the display panel 120. For example, the background behind the display panel 120 can be transmitted by the transmission region of the display panel 120 like transparent glass and can be provided to the user.

In addition, the light emitting diode can be disposed in the emission region to display the image information implemented by the display panel 120.

A first bottom cover 121 can be equipped at the lower end of the display panel 120 with respect to a first direction, which is the direction in which the display panel 120 is pulled up and withdrawn from the cover module 110. In an aspect, the first direction is +Y axis direction defined in the figures. However, the first direction could also be various directions applicable, e.g., a horizontal direction.

The first bottom cover 121 can be raised and lowered together with the display panel 120 while the display panel 120 is withdrawn from the cover module 110 or embedded in the cover module 110. When the display panel 120 is withdrawn from the cover module 110, the first bottom cover 121 can be disposed inside the cover module 110 to support the display panel 120.

A pair of first and second lead screw nuts 123*a* and 123*b* can be provided and mounted on both ends of the first bottom cover 121 and can be connected to the first driving system 150. Therefore, the first and second lead screw nuts

123*a* and 123*b* can be disposed at both ends of the display panel 120. The number and position of the lead screw nuts are not limited thereto.

Although not shown in the figures, a second bottom cover can also be equipped at the lower end of the light blocking plate 130 disposed on the rear surface of the display panel 120. The second bottom cover can be raised and lowered together with the light blocking plate 130 and can be disposed inside the cover module 110.

A pair of third and fourth lead screw nuts can be provided at both ends of the second bottom cover and can be connected to the second driving system 160, but aspects of the present disclosure are not limited thereto. For example, the second bottom cover may be connected to the first driving system 150 or other driving system not mentioned herein, and the second driving system 160 can operate with the first driving system 150 simultaneously or asynchronously.

The pair of guide rails 171*a* and 171*b* can be disposed at both ends of the display panel 120 and the light blocking plate 130 with respect to a second direction (e.g., transverse direction) perpendicular to the first direction in which the display panel 120 and the light blocking plate 130 are withdrawn. The pair of guide rails 171*a* and 171*b* can support and guide both ends of each of the display panel 120 and the light blocking plate 130, respectively, when the display panel 120 and the light blocking plate 130 are raised and lowered from the cover module 110.

The first and second driving systems 150 and 160 can be disposed below the display panel 120 and the light blocking plate 130, respectively. The first and second driving systems 150 and 160 can be disposed over a plate 115 forming a bottom surface of the cover module 110.

The first driving system 150 can include a first motor assembly 151, a first drive pulley 153 connected to a rotational shaft of the first motor assembly 151, and a pair of first and second driven pulleys 155*a* and 155*b* connected to the first drive pulley 153 through a first drive belt 157.

The first and second driven pulleys 155*a* and 155*b* can be disposed at both ends of the plate 115 in its longitudinal direction, respectively. First and second linear screw rods 158*a* and 158*b* can be equipped at the first and second driven pulleys 155*a* and 155*b* to rotate together according to the rotation of the first and second driven pulleys 155*a* and 155*b*.

Here, the first drive pulley 153 and the first and second driven pulleys 155*a* and 155*b* can be positioned coaxially with each other and connected to each other through the first drive belt 157. Accordingly, the first drive pulley 153 rotating by the first motor assembly 151 can rotate the first and second driven pulleys 155*a* and 155*b* by reducing the number of rotations at a predetermined gear ratio, and the first and second linear screw rods 158*a* and 158*b* can rotate according to the rotation of the first and second driven pulleys 155*a* and 155*b*.

At this time, the pair of first and second lead screw nuts 123*a* and 123*b* mounted on the first bottom cover 121 of the display panel 120 can be screwed to the first and second linear screw rods 158*a* and 158*b*, respectively. The pair of first and second lead screw nuts 123*a* and 123*b* can transmit power for raising and lowering the display panel 120 to the first bottom cover 121.

For example, the pair of first and second lead screw nuts 123*a* and 123*b* can be screwed to the first and second linear screw rods 158*a* and 158*b*, respectively, so that the first and second lead screw nuts 123*a* and 123*b* can be raised and lowered in the longitudinal direction of the first and second linear screw rods 158*a* and 158*b* according to the rotation of the first and second linear screw rods 158*a* and 158*b*.

Since the first and second lead screw nuts 123*a* and 123*b* are raised and lowered in the longitudinal direction of the first and second linear screw rods 158*a* and 158*b*, the display panel 120 can also be raised and lowered together with the first bottom cover 121 on which the first and second lead screw nuts 123*a* and 123*b* are mounted in the longitudinal direction of the first and second linear screw rods 158*a* and 158*b*.

For example, the first and second linear screw rods 158*a* and 158*b* can be rotated by the driving force of the first motor assembly 151 through the first drive belt 157, and the first and second lead screw nuts 123*a* and 123*b* can be raised and lowered by the rotation of the first and second linear screw rods 158*a* and 158*b*. Accordingly, the display panel 120 can also be raised and lowered together with the first bottom cover 121 on which the first and second lead screw nuts 123*a* and 123*b* are mounted in the longitudinal direction of the first and second linear screw rods 158*a* and 158*b*.

Therefore, the display panel 120 can be pulled down and embedded inside the cover module 110 or can be pulled up and withdrawn outside the cover module 110.

At this time, the first and second linear screw rods 158*a* and 158*b* for raising and lowering the first and second lead screw nuts 123*a* and 123*b* along the longitudinal direction can be disposed at both ends of the plate 115 in a second direction (e.g., transverse direction) perpendicular to the first direction in which the display panel 120 and the light blocking plate 130 are withdrawn, respectively, so that the first and second lead screw nuts 123*a* and 123*b* can be stably raised and lowered without being biased to either side. The number and position of the first and second linear screw rods 158*a* and 158*b* are not limited thereto.

Additionally, the second driving system 160 can also be configured as a structure similar to that of the first driving system 150. The second driving system 160 can include a second motor assembly 161, a second drive pulley 163 connected to a rotational shaft of the second motor assembly 161, and a pair of third and fourth driven pulleys 165*a* and 165*b* connected to the second drive pulley 163 through a second drive belt 167.

The second drive pulley 163 and the third and fourth driven pulleys 165*a* and 165*b* can be positioned coaxially with each other and connected to each other through the second drive belt 167. As shown in FIGS. 3A and 3B, third and fourth linear screw rods 168*a* and 168*b* can be equipped at the third and fourth driven pulleys 165*a* and 165*b*, respectively. Although not shown in the figures, a pair of third and fourth lead screw nuts mounted on the second bottom cover of the light blocking plate 130 can be screwed to the third and fourth linear screw rods 168*a* and 168*b*, respectively.

Accordingly, the third and fourth driven pulleys 165*a* and 165*b* can be rotated by the second drive pulley 163 rotated by the second motor assembly 161, and the third and fourth linear screw rods 168*a* and 168*b* can rotate according to the rotation of the third and fourth driven pulleys 165*a* and 165*b*.

In addition, the third and fourth lead screw nuts can be raised and lowered along the longitudinal direction of the third and fourth linear screw rods 168*a* and 168*b* according to the rotation of the third and fourth linear screw rods 168*a* and 168*b*, so that the light blocking plate 130 can also be raised and lowered together with the second bottom cover along the longitudinal direction of the third and fourth linear screw rods 168*a* and 168*b*.

The raising or lowering of the light blocking plate 130 through the second driving system 160 can be performed simultaneously with the display panel 120 or performed separately from the display panel 120 according to the user's intention.

Alternatively, in the display device 100 according to the aspect of the present disclosure, the display panel 120 and the light blocking plate 130 can be individually raised or lowered through the first and second driving systems 150 and 160, respectively, to be withdrawn out of the cover module 110 or embedded into the cover module 110.

Accordingly, by allowing only the display panel 120 to be withdrawn from the cover module 110 through the first driving system 150, the user can watch the image at both sides of the display panel 120. In addition, the light blocking plate 130 can be further withdrawn on the rear surface of the transparent display panel 120 through the second driving system 160 as necessary, so that the concentration of the image implemented through the display device 100 can be improved.

At this time, although not shown, a control printed circuit board connected to the display panel 120, a main board, and a power board can be mounted inside the cover module 110, and a cable penetrating member can also be further provided to protect a cable for connecting the main board and the control printed circuit board and a power cable for connecting the power board and the control printed circuit board.

One end of the cable penetrating member can be mounted on the cover module 110, and the other end of the cable penetrating member can be coupled to at least one of the first and second lead screw nuts 123*a* and 123*b*, so that the other end of the cable penetrating member can be raised and lowered together with the first bottom cover 121 when the display panel 120 is raised and lowered with respect to the cover module 110.

In the cable penetrating member, a plurality of connecting members having an empty space therein can be rotatably connected to each other so that the cable can pass through from the one end to the other end of the cable penetrating member. Accordingly, when the display panel 120 is raised and lowered, the cable penetrating member can maintain the "U" shape in which lengths of both sides thereof are changed so as to allow the cable to be raised and lowered without being interfered and damaged by the surrounding electronic components.

The display device 100 according to the aspect of the present disclosure can further include the first and second elevation assistance systems 180 and 190. By controlling the speeds of raising and lowering of the display panel 120 and the light blocking plate 130 from the cover module 110 through the first and second elevation assistance systems 180 and 190, it is possible to prevent the display panel 120 and the light blocking plate 130 from being rapidly lowered when embedded inside the cover module 110.

This will be described in more detail with reference to FIGS. 4A to 4C and FIGS. 5A and 5B.

Figure 4A:
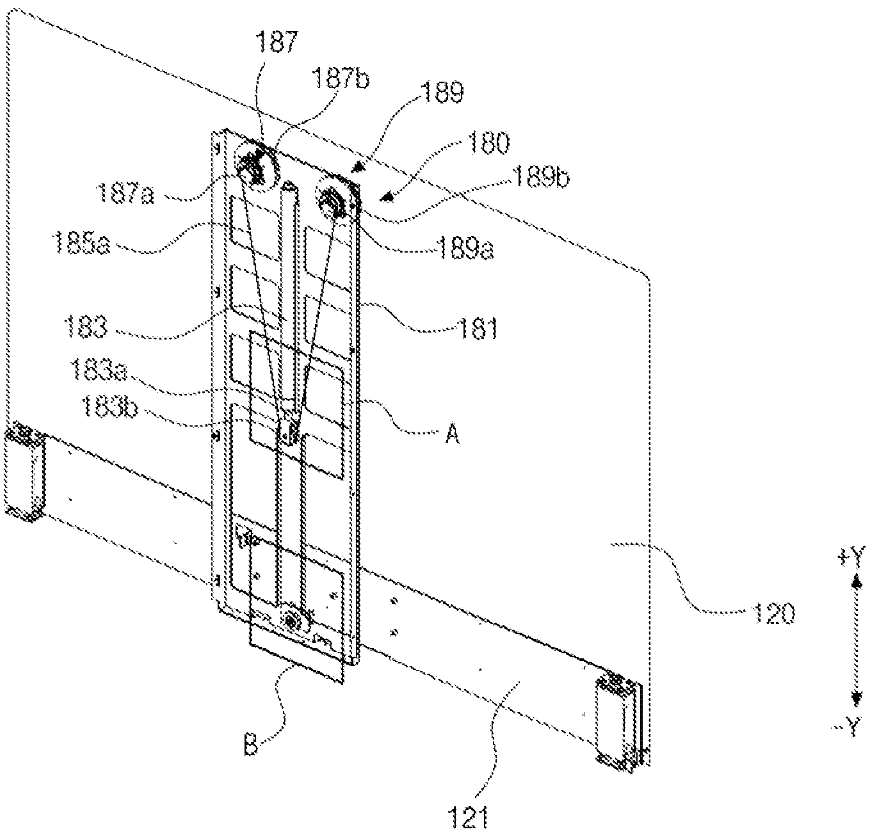
FIG. 4A is a perspective view illustrating the display panel and the first elevation assistance system of the display device according to an aspect of the present disclosure.
Figure 4B:
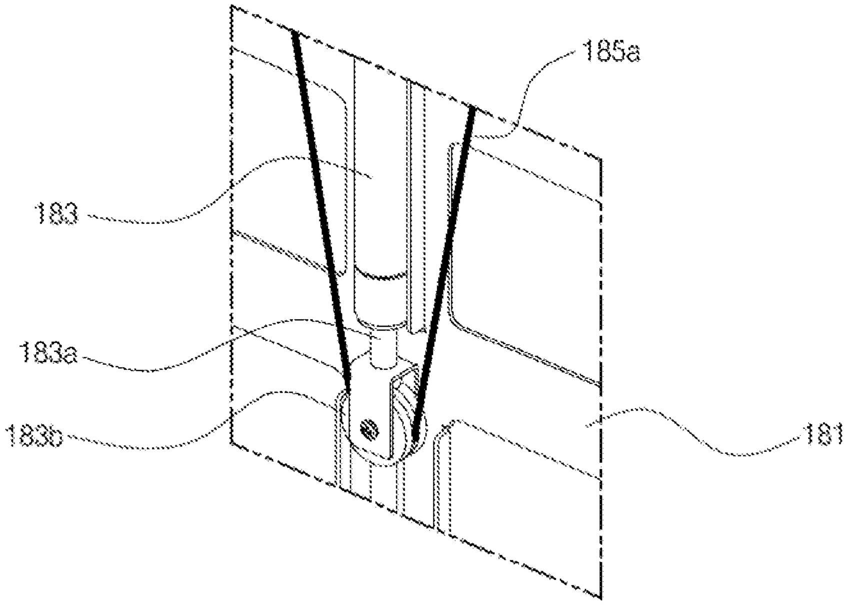
FIG. 4B is an enlarged perspective view illustrating the area A of FIG. 4A according to an aspect of the present disclosure.
Figure 4C:
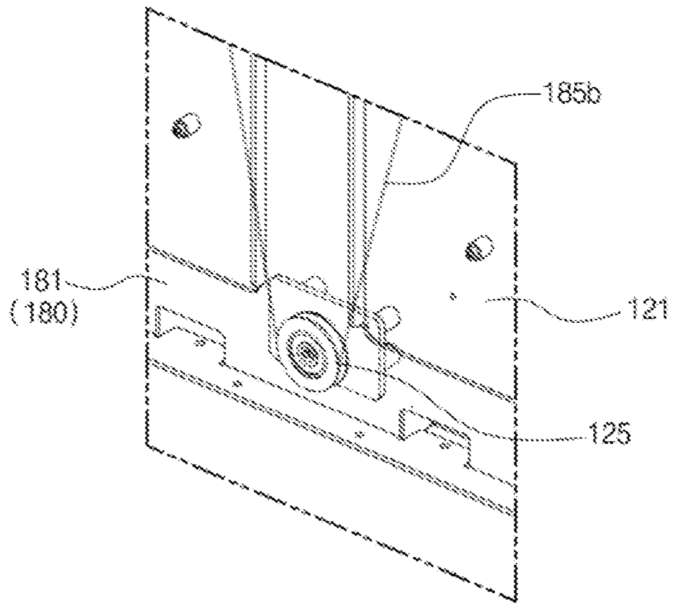
FIG. 4C is an enlarged perspective view illustrating the area B of FIG. 4A according to an aspect of the present disclosure.

FIG. 4A is a perspective view illustrating the display panel and the first elevation assistance system of the display device according to an aspect of the present disclosure, FIG. 4B is an enlarged perspective view illustrating the area A of FIG. 4A according to an aspect of the present disclosure, and FIG. 4C is an enlarged perspective view illustrating the area B of FIG. 4A according to an aspect of the present disclosure.

Figure 5A:
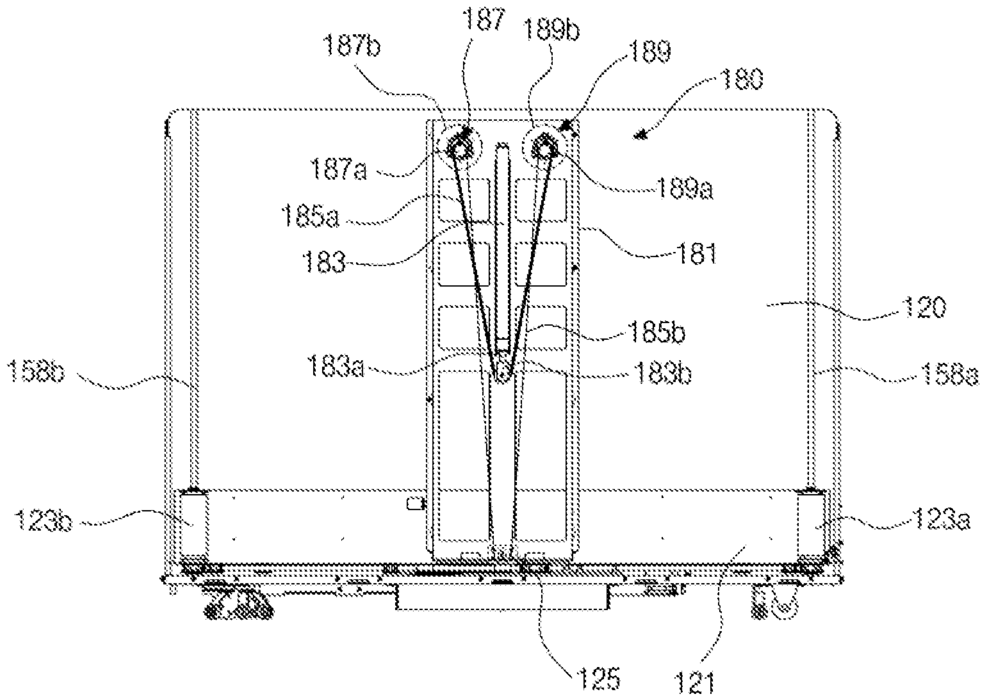
FIGS. 5A and 5B are perspective views illustrating operation of the first elevation assistance system according to an aspect of the present disclosure.
Figure 5B:
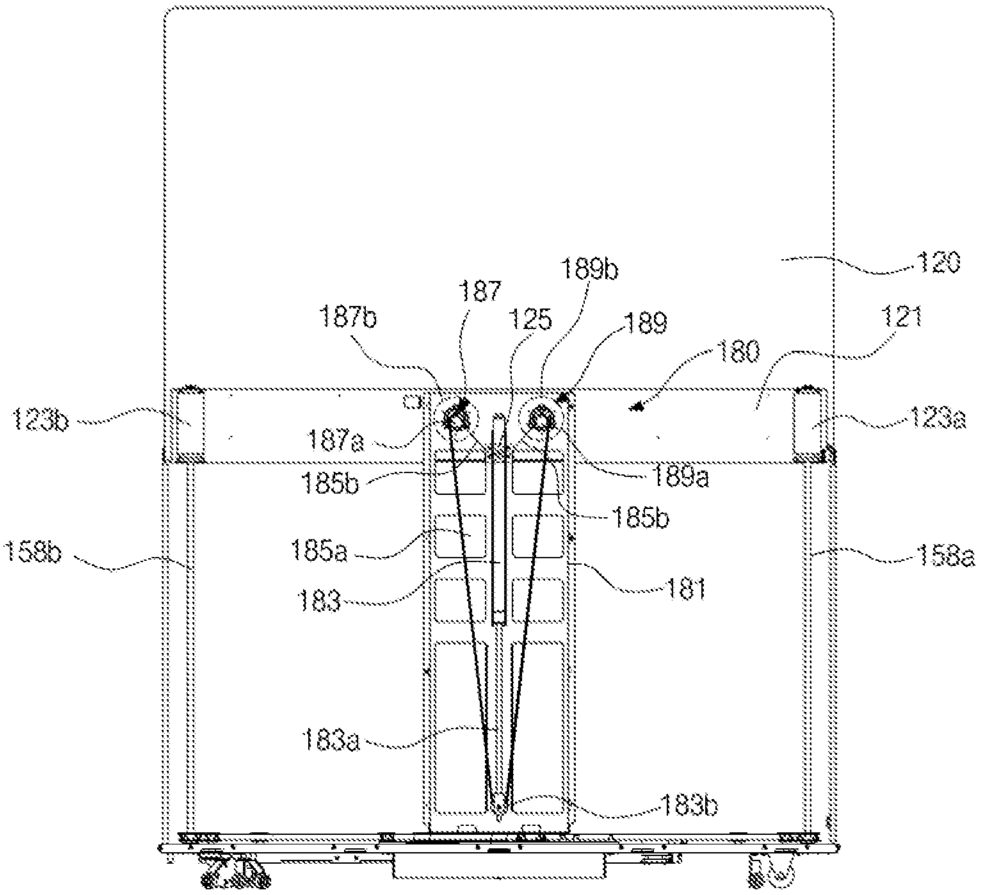

FIGS. 5A and 5B are perspective views illustrating the operation of the first elevation assistance system according to an aspect of the present disclosure. FIG. 5A shows a state in which the display panel is embedded inside the cover module and pulled down according to an aspect of the present disclosure, and FIG. 5B shows a state in which the display panel is withdrawn outside the cover module and pulled up according to an aspect of the present disclosure.

As shown in the figures, a rotatable first bottom wheel 125 can be mounted on the first bottom cover 121 equipped at the lower end of the display panel 120, and the first elevation assistance system 180 can be disposed on the front side of the display panel 120 corresponding to the first bottom wheel 125.

The first elevation assistance system 180 can include a first elevation plate 181, a first gas spring 183 equipped to the first elevation plate 181, first and second wires 185*a* and 185*b* connected to the first gas spring 183, and a first wheel bracket 187 and a second wheel bracket 189.

The first elevation plate 181 can be formed to have its longitudinal direction along the first direction in which the display panel 120 is withdrawn from the cover module 110 of FIG. 2. The first wheel bracket 187 and the second wheel bracket 189 can be quipped at the upper end of the front surface of the first elevation plate 181 based on the rear surface thereof which can face the display panel 120, and the first gas spring 183 can be disposed between the first wheel bracket 187 and the second wheel bracket 189.

The first wheel bracket 187 and the second wheel bracket 189 can penetrate the first elevation plate 181, first and second wheels 187*a* and 189*a* can protrude from the front surface of the first elevation plate 181, and third and fourth wheels 187*b* and 189*b* interlocked with the first and second wheels 187*a* and 189*a*, respectively, can protrude from the rear surface of the first elevation plate 181.

The first gas spring 183 can be equipped with a first rod 183*a* that increases or decreases along the longitudinal direction of the first gas spring 183 (e.g., +Y or −Y direction), and a first spring wheel 183*b* can be installed at one end of the first rod 183*a*. The first rod 183*a* can move along the longitudinal direction of the first gas spring 183, thereby increasing or decreasing its length exposed to the outside. The first wire 185*a* can be wound around the first spring wheel 183*b* while its one end is rotatably fixed to the first wheel 187*a* and its other end is rotatably fixed to the second wheel 189*a*.

The second wire 185*b* can be wound around the first bottom wheel 125 mounted on the bottom cover 121 of the display panel 120 while its one end is rotatably fixed to the third wheel 187*b* protruding from the rear surface of the first elevation plate 181 and its other end is rotatably fixed to the fourth wheel 189*b*.

At this time, the one ends of the first and second wires 185*a* and 185*b* can be fixed to the first and third wheels 187*a* and 187*b*, respectively, to be wound in opposite directions to each other. The other ends of the first and second wires 185*a* and 185*b* can be fixed to the second and fourth wheels 189*a* and 189*b*, respectively, to be wound in opposite direction to each other.

The first gas spring 183 tries to expand its volume according to the amount of gas filled therein, so that the first gas spring 183 can make the first and second wires 185*a* and 185*b* increase by the force to expand the volume. Accordingly, when the one end of the first wire 185*a* is wound around the first wheel 187*a*, the one end of the second wire 185*b* can be unwound from the third wheel 187*b*. When the other end of the first wire 185*a* is wound around the second wheel 189*a*, the other end of the second wire 185*b* can be unwound from the fourth wheel 189*b*.

On the contrary, when the one end and the other end of the first wire 185*a* are unwound from the first and second wheels 187*a* and 189*a*, respectively, the one end and the other end of the second wire 185*b* can be wound around the third and fourth wheels 187*b* and 189*b*, respectively.

The first gas spring 183 and the first and second wires 185*a* and 185*b* can be organically coupled to each other, so that the first elevation assistance system 180 can control the speed of raising and lowering the display panel 120 by the repulsive force of the first gas spring 183.

For example, in the process of increasing or decreasing the first rod 183*a* of the first gas spring 183, since a force can be applied in the +Y axis direction defined in the figures, the force can be balanced with a force applied to the display panel 120, so that the user can easily raise and lower the display panel at a stable speed.

The operation of the display panel 120 and the first elevation assistance system 180 will be described in detail with reference to FIGS. 5A and 5B. As shown in FIG. 5A, in a pull-down state when the display panel 120 is embedded inside the cover module 110 of FIG. 2, the first bottom cover 121 equipped at the lower end of the display panel 120 can be disposed to correspond to the lower end of the first elevation assistance system 180, and the second wire 185*b* wound around the third and fourth wheels 187*b* and 189*b* can be unwound, thereby increasing the length of the second wire 185*b*. Through this, the first wire 185*a* can be wound around the first and second wheels 187*a* and 189*a*.

Accordingly, the first rod 183*a* of the first gas spring 183 can be embedded and disposed inside the first gas spring 183.

At this time, when the display panel 120 is to be withdrawn from the cover module 110 of FIG. 2 through the first driving system 150, for example, when the display panel 120 is to be disposed in the pull-up state of FIG. 5B from the pull-down state of FIG. 5A, the display panel 120 can be withdrawn from the cover module 110 of FIG. 2, and the second wire 185*b* can be wound around the third and fourth wheels 187*b* and 189*b*, so that the first wire 185*a* can be unwound from the first and second wheels 187*a* and 189*a* and become longer.

In addition, in the first gas spring 183 of the first elevation assistance system 180, the first rod 183*a* can be extended in the −Y axis direction defined in the figures, and thus the force can be applied to the first gas spring 183 in the +Y axis direction defined in the figures.

Accordingly, the force can also be applied to the display panel 120 to be withdrawn from the cover module 110 of FIG. 2 in the +Y axis direction defined in the figures. Since the forces can be applied to the first elevation assistance system 180 and the display panel 120 in the same or substantially same direction, the display panel 120 can be more easily withdrawn from the cover module 110 of FIG. 2 with a small force.

On the contrary, as shown in FIG. 5B, when the display panel 120 is disposed to be withdrawn outside the cover module 110 of FIG. 2. For example, when the display panel 120 is to be disposed in the pull-down state of FIG. 5A from the pull-up state of FIG. 5B, the first bottom cover 121 equipped at the lower end of the display panel 120 can be disposed to correspond to the upper end of the first elevation assistance system 180, and the second wire 185*b* can be wound around the third and fourth wheels 187*b* and 189*b*. Through this, the first wire 185*a* can be unwound from the first and second wheels 187*a* and 189*a* and become longer.

Accordingly, the first rod 183*a* of the first gas spring 183 can be extended to the outside of the first gas spring 183.

In this case, when the display panel 120 is tried to be embedded inside the cover module 110 of FIG. 2 through the first driving system 150, the second wire 185*b* can be unwound from the third and fourth wheels 187*b* and 189*b* due to the display panel 120 to be embedded inside the cover module 110 of FIG. 2, so that the first wire 185*a* can be wound around the first and second wheels 187*a* and 189*a*.

In addition, in the first gas spring 183 of the first elevation assistance system 180, the first rod 183*a* can be gradually reduced from the state in which the first rod 183*a* is extended in the −Y axis direction defined in the figures, and the force can be applied to the first gas spring 183 in the +Y axis direction defined in the figures until the first rod 183*a* is completely inserted into the first gas spring 183.

Meanwhile, a force can be applied to the display panel 120 embedded into the cover module 110 of FIG. 2 in the −Y axis direction defined in the figures. Accordingly, the forces can be applied to the first elevation assistance system 180 and the display panel 120 in the opposite directions.

At this time, since the force applied to the first elevation assistance system 180 and the force applied to the display panel 120 are balanced with each other, the user can easily lower the display panel 120 at a stable speed.

Therefore, it is possible to prevent the display panel 120 from being rapidly lowered in the process of embedding the display panel 120 inside the cover module 110 of FIG. 2, and it is also possible to prevent the display panel 120 from being damaged.

Here, the second elevation assistance system 190 of FIG. 2 can also have the same structure as the first elevation assistance system 180, so that when the light blocking plate 130 of FIG. 2 is raised and lowered through the second driving system 160 of FIG. 2, the speeds of raising and lowering the light blocking plate 130 of FIG. 2 from the cover module 110 of FIG. 2 can be controlled through the second elevation assistance system 190 of FIG. 2. Accordingly, it is possible to prevent the light blocking plate 130 of FIG. 2 from being rapidly lowered in the process of embedding the light blocking plate 130 of FIG. 2 inside the cover module 110 of FIG. 2.

As described above, in the display device 100 of FIG. 2 according to the aspect of the present disclosure, the display panel 120 and the light blocking plate 130 of FIG. 2 can be allowed to be raised and lowered from furniture, an appliance, a facility, or the like such as a bed headboard, a desk, or a partition through a simple structure and operation such as the first and second driving systems 150 and 160 of FIG. 2 to thereby improve space utilization, interior, and design.

Moreover, through the transparent display panel 120, the user can be allowed to watch the image at both sides of the display panel 120, and the light blocking plate 130 of FIG. 2 can be further raised and lowered on the rear surface of the transparent display panel 120, so that the concentration of the image implemented through the transparent display panel 120 can be improved. Accordingly, the user can feel the image implemented from the display panel 120 more clearly.

Further, the display device 100 of FIG. 2 according to the aspect of the present disclosure can further include the first and second elevation assistance systems 180 and 190 of FIG. 2, and the speeds of raising and lowering the display panel 120 and the light blocking plate 130 of FIG. 2 can be controlled, so that the display panel 120 and the light blocking plate 130 of FIG. 2 can be prevented from being rapidly lowered in the process of embedding them inside the cover module 110 of FIG. 2.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a cover module having a storage space therein;

a display panel configured to be at least partially disposed inside the storage space or withdrawn outside the storage space;

a first driving system configured to embed the display panel into the cover module or withdraw the display panel from the cover module in a first direction;

a light blocking plate on a rear surface of the display panel and configured to be at least partially embedded inside the storage space or withdrawn outside the storage space;

a second driving system configured to embed the light blocking plate into the cover module or withdraw the light blocking plate from the cover module in the first direction; and a first elevation assistance system disposed inside the storage space, wherein a force in the opposite direction is applied to the display panel and the first elevation assistance system to control a speed of raising and lowering the display panel, and wherein the first driving system and the second driving system are independently driven to move spatially the display panel and the light blocking plate according to a transmission mode and a light blocking mode, thereby storing and retrieving the display panel and the light blocking plate in and from the cover module.

2. The display device of claim 1, wherein the first direction is a vertical direction.

3. The display device of claim 1, further comprising:

a bottom cover equipped at a lower end of the display panel in the first direction; and a pair of first and second lead screw nuts mounted on both sides of the bottom cover and connected to the first driving system.

4. The display device of claim 3, wherein the first driving system is disposed at an inner side of the display panel in the first direction and includes a motor assembly, a drive pulley receiving a rotational force of the motor assembly, and a pair of first and second driven pulleys connected to the drive pulley through a drive belt, and wherein first and second linear screw rods are equipped at the first and second driven pulleys, respectively, and the first and second lead screw nuts are screwed to the first and second linear screw rods, respectively.

5. The display device of claim 4, wherein the first and second lead screw nuts are disposed at both ends of the display panel.

6. The display device of claim 2, further comprising:

a bottom cover equipped at a lower end of the display panel; and a bottom wheel mounted on the bottom cover, wherein the first elevation assistance system is coupled to the bottom wheel.

7. The display device of claim 6, wherein the first elevation assistance system includes an elevation plate, first and second wheel brackets, a gas spring between the first and second wheel brackets, and first and second wires, and wherein a rod provided with a spring wheel at an end thereof is mounted on the gas spring.

8. The display device of claim 7, wherein the first wire is wound around the spring wheel while one end is rotatably fixed to a first wheel of the first wheel bracket and another end is rotatably fixed to a second wheel of the second wheel bracket, and wherein the second wire is wound around the bottom wheel while its one end is rotatably fixed to a third wheel of the first wheel bracket and its other end is rotatably fixed to a fourth wheel of the second wheel bracket.

9. The display device of claim 8, wherein the first wire is disposed on a front surface of the elevation plate, and the second wire is disposed on a rear surface of the elevation plate.

10. The display device of claim 8, wherein the third and fourth wheels are configured to be respectively interlocked with the first and second wheels.

11. The display device of claim 10, wherein the first and second wheel brackets are configured to penetrate the elevation plate, the first and second wheels are configured to protrude from a front surface of the elevation plate, and the third and fourth wheels are configured to protrude from a rear surface of the elevation plate.

12. The display device of claim 8, wherein the one end of the first and second wires are configured to be wound in opposite directions to each other, and the another end of the first and second wires are configured to be wound in opposite direction to each other, and wherein when the one end and the another end of the first wire are unwound from the first and second wheels, respectively, the one end and the other end of the second wire are wound around the third and fourth wheels, respectively.

13. The display device of claim 7, wherein the rod is configured to increase or decrease along a longitudinal direction of the gas spring under a repulsive force of the gas spring, as the spring wheel moves.

14. The display device of claim 1, wherein the display device further comprises:

a first elevation assistance system disposed inside the storage space and configured to control a speed of raising and lowering the display panel; and a second elevation assistance system disposed inside the storage space and configured to control a speed of raising and lowering the light blocking plate, wherein the first direction is a vertical direction.

15. The display device of claim 1, wherein the display panel is a transparent display panel.

16. The display device of claim 1, wherein moving of the light blocking plate through the second driving system is performed simultaneously with the display panel or performed separately from the display panel.

17. The display device of claim 1, wherein a pair of guide rails are disposed at both ends of the cover module in a second direction perpendicular to the first direction to support and guide both ends of the display panel.

* * * * *